United States Patent
Farooq et al.

(10) Patent No.: US 10,296,698 B2
(45) Date of Patent: May 21, 2019

(54) FORMING MULTI-SIZED THROUGH-SILICON-VIA (TSV) STRUCTURES

(71) Applicant: GLOBALFOUNDRIES INC., Grand Cayman (KY)

(72) Inventors: Mukta G. Farooq, Hopewell Junction, NY (US); Troy L. Graves-Abe, Wappingers Falls, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 57 days.

(21) Appl. No.: 15/378,122

(22) Filed: Dec. 14, 2016

(65) Prior Publication Data

US 2018/0165402 A1    Jun. 14, 2018

(51) Int. Cl.
*G06F 17/50* (2006.01)
*H01L 21/768* (2006.01)

(52) U.S. Cl.
CPC .... *G06F 17/5077* (2013.01); *H01L 21/76898* (2013.01)

(58) Field of Classification Search
CPC .................................................. G06F 17/5077
USPC .................................................. 716/130
See application file for complete search history.

(56) References Cited

U.S. PATENT DOCUMENTS

| | | | |
|---|---|---|---|
| 8,455,995 B2 | 6/2013 | Tsai et al. | |
| 2002/0088769 A1* | 7/2002 | Antaki | H01L 22/12 216/59 |
| 2010/0210043 A1* | 8/2010 | Liu | H01L 22/34 438/17 |
| 2011/0215457 A1* | 9/2011 | Park | H01L 23/3677 257/686 |
| 2013/0082341 A1* | 4/2013 | Shimizu | H01L 27/14636 257/431 |
| 2016/0034633 A1* | 2/2016 | Han | G06F 17/5081 716/115 |

* cited by examiner

*Primary Examiner* — Suresh Memula
(74) *Attorney, Agent, or Firm* — Anthony Canale; Hoffman Warnick LLC

(57) ABSTRACT

Various embodiments include approaches for designing through-silicon vias (TSVs) in integrated circuits (ICs). In some cases, a method includes: identifying types of through-silicon vias (TSVs) for placement within an integrated circuit (IC) design based upon an electrical requirement for the TSVs, wherein the IC design includes distinct types of TSVs; calculating etch and fill rates for the IC design with the distinct types of TSVs with common etching and filling processes; and providing fabrication instructions to form the distinct types of TSVs according to the calculated etch and fill rates in the common processes.

19 Claims, 10 Drawing Sheets

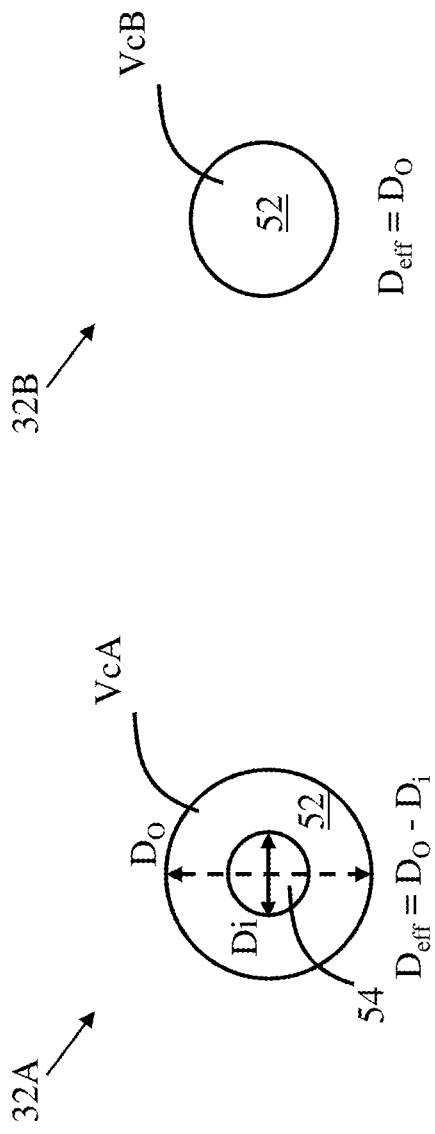

US 10,296,698 B2

FORMING MULTI-SIZED THROUGH-SILICON-VIA (TSV) STRUCTURES

FIELD

The subject matter disclosed herein relates to integrated circuits. More particularly, the subject matter disclosed herein relates to integrated circuit devices and approaches for designing and forming integrated circuit devices having through-silicon vias (TSVs) of varying sizes for particular functions.

BACKGROUND

Three-dimensional (3D) integrated circuit (IC) devices utilize stacked wafers and/or dies that are vertically interconnected using through-silicon vias (TSVs), so that the wafers or dies perform as a single device. 3D ICs can provide enhanced performance, with reduced power usage (and a smaller footprint) than conventional two-dimensional IC devices. 3D ICs generally have functional capabilities such as logic and/or memory capabilities. Reduced-capability 3D ICs, which are also referred to in the art as 2.5D ICs, can have similar construction as their 3D counterparts, but may have relatively diminished capabilities. These 2.5D ICs may include interposers or other passive devices.

In any case, 3D ICs and 2.5D ICs are becoming more prevalent in the semiconductor industry due in part to their ability to handle complex tasks within a small package. However, these more compact devices present greater challenges in terms of design, scaling and interconnection of components. For example, in terms of TSVs, it may be difficult to locate and fabricate particular types of TSVs for specific functions (e.g., power or signal) given the compact nature of 3D ICs and 2.5D IC devices.

BRIEF DESCRIPTION

Various embodiments of the disclosure include approaches for designing through-silicon vias (TSVs) in integrated circuits (ICs). In some particular aspects of the disclosure, a method includes: identifying types of through-silicon vias (TSVs) for placement within an integrated circuit (IC) design based upon an electrical requirement for the TSVs, wherein the IC design includes distinct types of TSVs; calculating etch and fill rates for the IC design with the distinct types of TSVs with common etching and filling processes; and providing fabrication instructions to form the distinct types of TSVs according to the calculated etch and fill rates in the common processes.

In other aspects of the disclosure, a system includes: at least one computing device configured to design through-silicon vias (TSVs) in an integrated circuit (IC) design by performing actions including: identifying types of TSVs for placement within the IC design based upon an electrical requirement for the TSVs, wherein the IC design includes distinct types of TSVs; calculating etch and fill rates for the IC design with the distinct types of TSVs with common etching and filling processes; and providing fabrication instructions to form the distinct types of TSVs according to the calculated etch and fill rates in the common processes.

Another aspect of the disclosure includes a computer program product having program code stored on a computer-readable storage medium, which when executed by at least one computing device, causes the at least one computing device to design through-silicon vias (TSVs) in an integrated circuit (IC) design by performing actions including: identifying types of TSVs for placement within the IC design based upon an electrical requirement for the TSVs, wherein the IC design includes distinct types of TSVs; calculating etch and fill rates for the IC design with the distinct types of TSVs with common etching and filling processes; and providing fabrication instructions to form the distinct types of TSVs according to the calculated etch and fill rates in the common processes.

BRIEF DESCRIPTION OF THE FIGURES

These and other features of this invention will be more readily understood from the following detailed description of the various aspects of the invention taken in conjunction with the accompanying drawings that depict various embodiments of the invention, in which:

FIG. 4 shows a schematic top view of a first type of TSV according to embodiments of the disclosure.

FIG. 5 shows a schematic top view of a second type of TSV according to embodiments of the disclosure.

Figure 1:
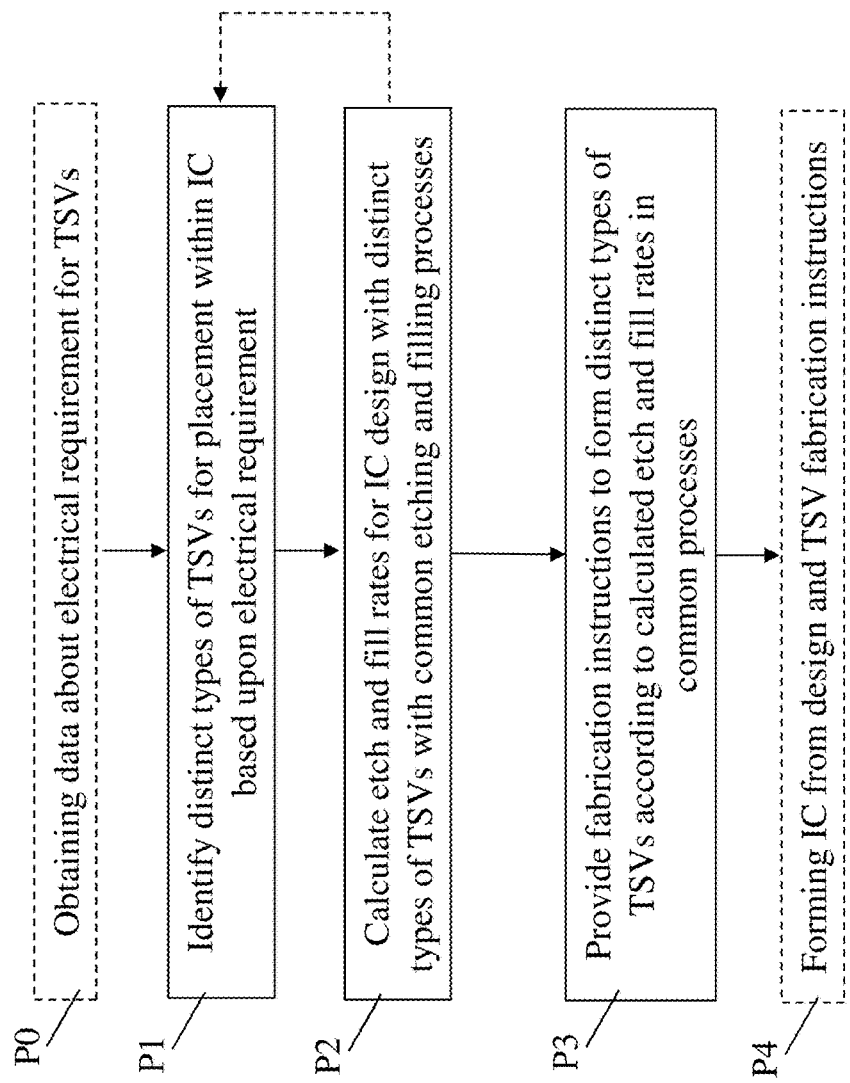
FIG. 1 shows a flow diagram illustrating a method performed according to various embodiments of the disclosure.

It is noted that the drawings of the invention are not necessarily to scale. The drawings are intended to depict only typical aspects of the invention, and therefore should not be considered as limiting the scope of the invention. In the drawings, like numbering represents like elements between the drawings.

DETAILED DESCRIPTION

As indicated above, the subject matter disclosed herein relates to integrated circuits (ICs). More particularly, the subject matter disclosed herein relates to ICs and related approaches for designing and forming ICs having through-silicon vias (TSVs) of varying sizes for particular functions. In particular, these ICs can include TSVs with distinct volumes, tailored for particular functions (e.g., power function or signal function).

In contrast to conventional approaches, various embodiments of the disclosure include approaches for forming IC structures (e.g., 3D IC structures or 2.5D IC structures) with multi-sized TSVs at a same device depth. That is, these processes can include using a single process flow to form TSVs with a common depth but a distinct volume of conductive material (e.g., metal such as copper), also referred to as a conductive volume herein. Each TSV conductive volume can be designed based upon a particular function, for example, a signal function, a power function, etc. As noted herein, approaches allow for formation of distinct types of TSVs (where type denotes function), at a common depth (same depth within a layer and same depth within an IC structure) in a common process flow (e.g., including at least one, if not substantially all, processes). In particular cases, a process can include: a) obtaining an electrical requirement for a set of TSVs in an IC design; b) identifying types of TSVs for placement within the IC design, where the IC design includes distinct types of TSVs (distinctness in function, such as power v. signal); c) calculating etch and fill rates for the IC design with the distinct types of TSVs with common etching and filling processes; and d) forming the distinct types of TSVs according to the calculated etch and fill rates in a common process. In some cases, processes (a) and/or (d) can be omitted, such as when the process is implemented in a software or hardware configuration. For example, a TSV design system can be configured to identify types of TSVs for placement within an IC design (including at least one location with distinct types of TSVs) based upon an electrical requirement for those TSVs, calculate etch and fill rates for the distinct types of TSVs with common etching and filling processes, and provide fabrication instructions, e.g., to a fabrication system, to form the distinct types of TSVs according to the calculated etch and fill rates in the common processes.

In the following description, reference is made to the accompanying drawings that form a part thereof, and in which is shown by way of illustration specific example embodiments in which the present teachings may be practiced. These embodiments are described in sufficient detail to enable those skilled in the art to practice the present teachings and it is to be understood that other embodiments may be utilized and that changes may be made without departing from the scope of the present teachings.

FIG. 1 shows a flow diagram illustrating processes according to various embodiments of the disclosure. A TSV design system 28 (FIG. 2) can perform various processes as described herein to design TSVs in an IC design (IC design data 30). In some cases, the IC design (data) 30 can include data representing a three-dimensional (or 2.5 dimensional) IC (such as IC structure 130), however, the aspects disclosed herein are not limited to particular types of IC designs. IC design (data) 30 can include performance requirement data about an IC structure 130 (which may be a 3D IC or other IC structure), including data about performance requirements such as a processing speed (e.g., switching speed) of IC structure 130, a voltage of IC structure 130, an operating temperature of IC structure 130, a frequency (operating frequency) of IC structure 130 or a nominal current leakage of IC structure 130. It is understood that IC structure 130 can represent any of a number of IC devices, and that reference to a single IC structure is intended merely for simplicity of explanation. It is understood that IC design (data) 30 can further include additional information about IC structure 130, such as information about physical relationships of components in IC structure 130, e.g., a number of levels within IC structure 130; thicknesses, positions, lengths, etc., of lines, vias, interconnects, gate regions, etc. within one or more levels of IC structure 130; material types of one or more components within IC structure 130; etc.

Figure 2:
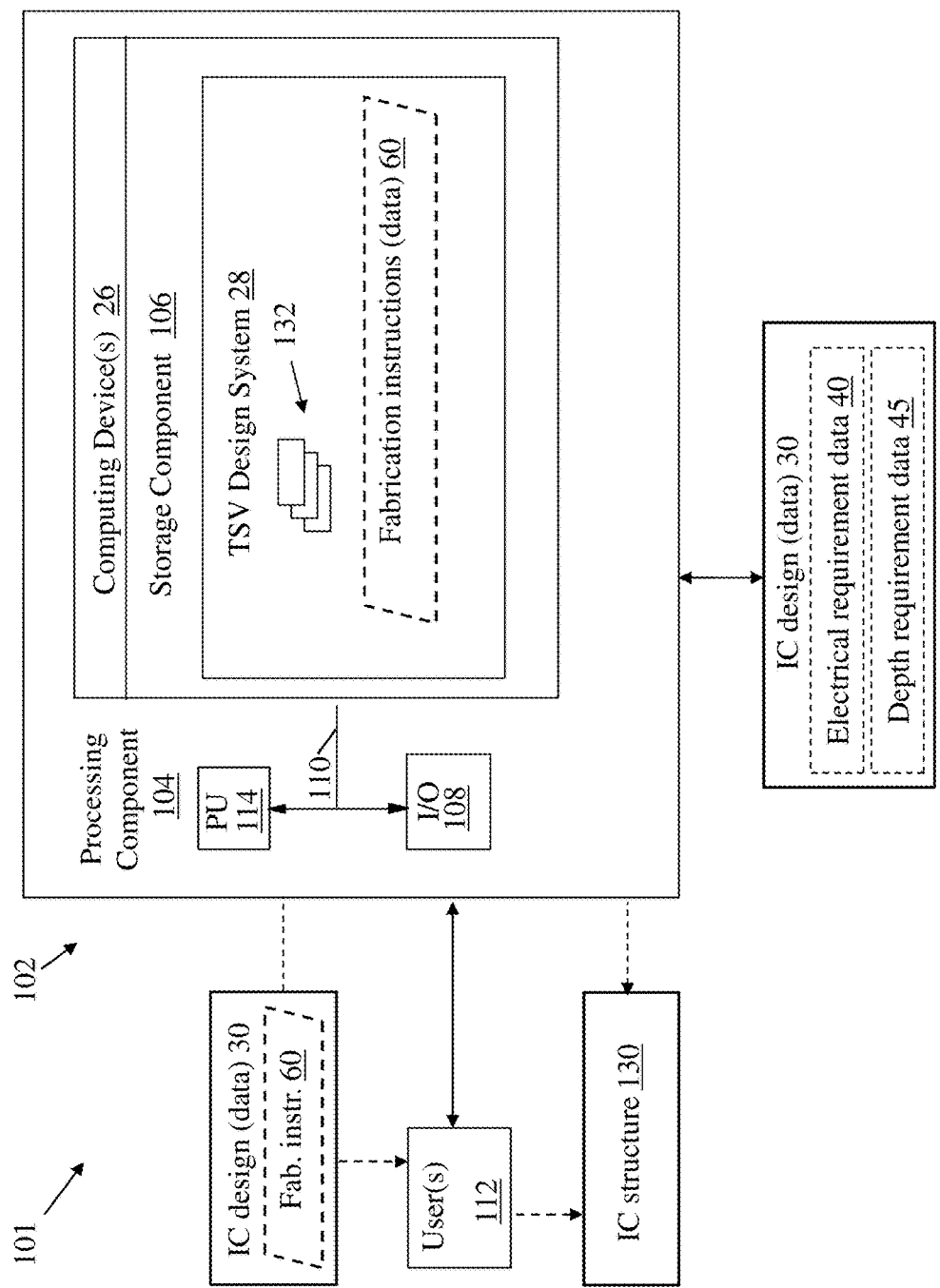
FIG. 2 shows an environment including a system for designing through-silicon vias (TSVs), according to various embodiments of the disclosure.
Figure 3:
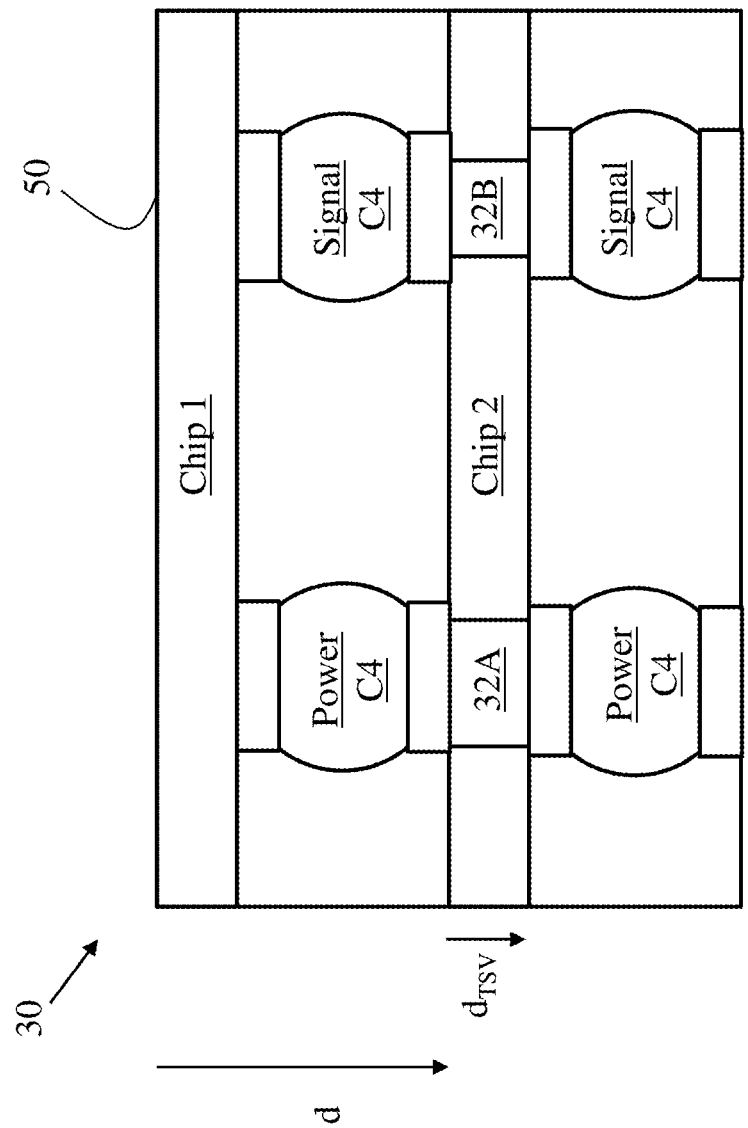
FIG. 3 shows a schematic depiction of a portion of an example integrated circuit design according to various embodiments of the disclosure.

The processes shown in FIG. 1 are described in conjunction with TSV design system 28 and related data in FIG. 2, as well as the schematic views of example IC designs (layouts) 30 and TSVs in FIGS. 3-5. As noted herein, IC design 30, shown in cross-sectional depiction of FIG. 3, includes at least a portion of an integrated circuit, and is intended to illustrate various aspects of the disclosure. Additionally, the TSVs 32 (32A, 32B) shown in FIGS. 3-5 are example TSV structures intended merely to illustrate various aspects of the disclosure. These TSVs 32 are shown in a side-cross-sectional view in FIG. 3 as part of a larger IC design 30, and are shown in plan views in FIGS. 4 and 5. When describing "volume" as it pertains to TSVs, the disclosure refers to the physical, three-dimensional aspect of that component. As will be noted herein, various aspects of the disclosure allow for formation of distinct TSV types, such as power and signal TSVs, at a common depth within an IC, using common processes of formation. In many cases, these TSVs are etched and filled according to the same processes, but have different resulting conductive volumes (e.g., volumes of conductive material). This can be seen, for example, in the distinctions between the outer diameters ($D_o$) of each TSV 32A, 32B illustrated in FIGS. 5 and 6, respectively. Turning to FIG. 1, processes according to various embodiments can include:

Process P1: identifying types of through-silicon vias (TSVs) 32A (TSV type A), 32B (TSV type B), etc. for placement within an integrated circuit (IC) design (data) 30 (FIGS. 2, 3) based upon an electrical requirement (electrical requirement data 40) for the TSVs 32A, 32B, etc. (FIGS. 2, 3). In various embodiments IC design 30 includes multiple types of TSVs, for example, both power TSV(s) and signal TSV(s). In various embodiments, electrical requirement data 40 indicates minimum and/or maximum impedances for a TSV connection at a particular location within IC design 30. In some cases, electrical requirement data 40 can include a range of impedances that a particular TSV, or distinct types of TSVs, can operate within according to design specifications (e.g., according to the design of that TSV). In some cases, based upon electrical requirement data 40, two distinct types of TSV are required at a same depth within IC design 30 (e.g., within a same level or connecting two common levels). It is understood that the aspects of the disclosure may not similarly apply to scenarios where a location within an IC design 30 requires distinct TSV types at different depths within the IC design 30. In those circumstances, it may be impractical to perform common etching and deposition processes on two distinct TSV types at distinct depths within IC design 30. According to various embodiments, IC design 30 includes distinct types of TSVs (e.g., 32A and 32B). In some cases, TSV design system 28 (FIG. 2) is configured to obtain (e.g., receive, download, store or otherwise access) IC design (data) 30, representative of an IC to be manufactured (also referred to as fabricated).

As described herein, conventional approaches were unable to efficiently design and fabricate an IC that included multiple types of TSVs at a common level, because these conventional approaches required separate, non-parallel fabrication processes for the distinct TSV types. According to various aspects of the disclosure, an initial process (P1) can include identifying types of TSVs that will meet the impedance characteristics (electrical requirement data 40) of an IC design 30. This process can include analyzing IC design (data) 30, and in particular, electrical requirement data 40 to determine which electrical properties (e.g., device power, device signaling, switching, etc.) are prioritized for locations within the IC design (data) 30, and selecting more than one type of TSV, e.g., a power TSV (32A) and a signal TSV (32B) (FIG. 3) to meet those impedance characteristics. In particular, this process can include identifying distinct TSV types 32A, 32B for IC design (data) 30 within a same fabrication window or layer. According to various embodiments, the IC design (data) 30 can include depth requirement data 45, which can include information about the depth at which distinct types of TSVs should be located within that IC to be formed (e.g., IC structure 130, FIG. 2).

FIG. 3 shows an illustrative example of a cross-section through IC design 30 having two distinct TSVs 32A, 32B (type A, type B). As shown, IC design 30 can include a first chip (Chip 1), which may be an upper chip, a second chip (Chip 2), which may be a lower chip, signal C4s (controlled collapse chip connections) connecting Chip 1 and Chip 2 for providing signal functions, and power C4s connecting Chip 1 and Chip 2 for providing power functions. It is understood that power C4 and signal C4 at the bottom of the depiction of IC design 30 can be connected to other external circuitry or a board (not shown). First TSV 32A, which can include a power TSV, connects the power C4s through Chip 2. Similarly, second TSV 32B, which can include a signal TSV, connects the signal C4s through Chip 2.

As noted herein, TSVs 32 at a common depth within IC design 30 are targeted for design according to various embodiments. That is, TSV design system 28 can identify TSVs as having a common depth (d) within IC design 30, as measured from a surface 50 (e.g., an upper surface of Chip 1, or another reference point) within IC design 30. Further, in some cases, TSV 32A and TSV 32B can be identified as having a common component depth ($d_{TSV}$). This information may be provided, for example, in depth requirement data 45. In some cases, only TSVs identified as having a common depth (d) within IC design 30 and a common component depth ($d_{TSV}$) are selected for design. In these cases, fabrication processes for these TSVs can be effectively linked such that distinct types of TSVs 32A, 32B can be fabricated with common processes. According to various embodiments, in order build provide distinct types of TSVs 32A, 32B at a common depth (IC design depth (d) and/or component depth ($d_{TSV}$)), TSV 32A and TSV 32B will have distinct conductive volumes. That is, TSV design system 28 is configured to select distinct TSVs 32A, 32B for particular TSV functions at a common depth in IC design 30, but in order to provide these distinct functions, TSVs 32A, 32B are designed with distinct conductive volumes. FIG. 4 shows a schematic top view of TSV 32A (e.g., a power TSV), while FIG. 5 shows a schematic top view of TSV 32B (e.g., a signal TSV). As shown, TSV 32A has a first conductive volume $V_{cA}$ while TSV 32B has a second conductive volume $V_{cB}$, which may be smaller than first conductive volume $V_{cA}$. It is understood that these references to conductive volumes $V_{cA}$, $V_{cB}$ are merely depicting two-dimensional areas, however, as noted herein, the component depth ($d_{TSV}$) of TSVS 32A, 32B is the same, so the variation in conductive volume is due to the distinction in $D_o/D_i$ as shown in FIGS. 4 and 5. TSV 32B (e.g., signal TSV) can include a unitary TSV consisting of a first material 52, such as a conductive material like a metal (e.g., copper). It is understood that according to various embodiments, first material 52 can include any conductive material useful as a TSV, including a composite material, but regardless of material type, TSV 32B consists substantially (e.g., exclusive of a liner) of first material 52. TSV 32A (e.g., power TSV) can include an annular TSV including first material 52 (conductor) and a second material 54, distinct from the first material 52. In various embodiments, second material 54 is an insulator, such as silicon, silicon dioxide or the like. In some embodiments, first material 52 surrounds second material 54 in TSV 32A.

Returning to FIG. 1, in various embodiments, following Process P1, a second process, Process P2 can include: calculating etch and fill rates for the IC design 30 with the distinct types of TSVs 32A, 32B with common etching and filling processes. With particular reference to FIGS. 3-5, TSV design system 28 can calculate etch and fill rates for TSVs 32A, 32B according to their effective diameter ($D_{eff}$) and a constant (k) that is linked with the material types (e.g., first material 52 and/or second material 54) and/or etch techniques (e.g., reactive ion etching, or RIE, wet etching, isotropic etching v. anisotropic etching, etc.). TSV design system 28 can calculate an etch and/or fill rate for the IC design 30 using the relationship between effective diameter ($D_{eff}$) and etch depth, as defined by:

$$\text{Etch depth} = k^{*}(\text{effective diameter})^{0.3} \quad \text{(Equation 1)}$$

Figure 6:
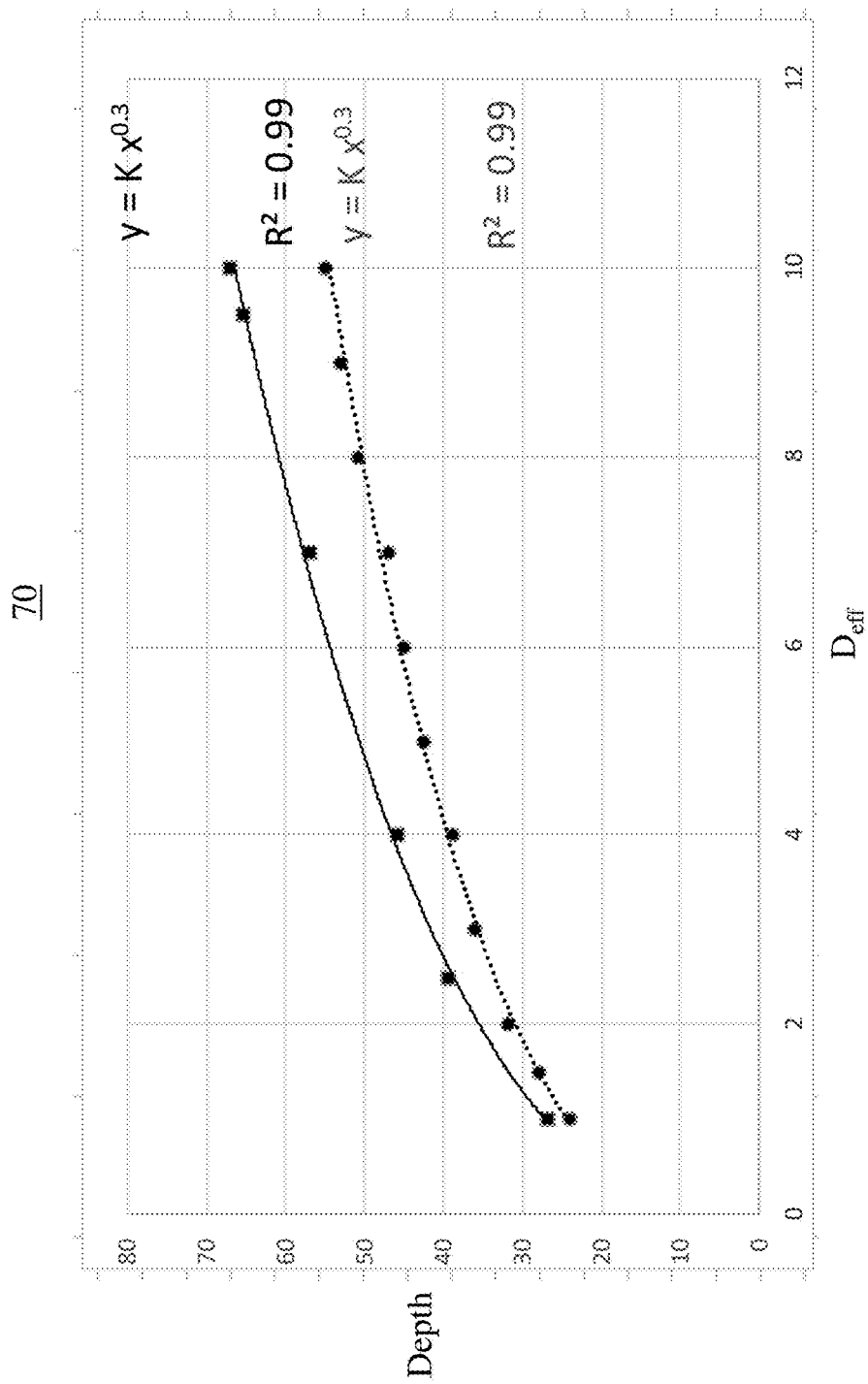
FIG. 6 shows an example graphical depiction demonstrating the relationship between depth and effective diameter in etching processes.

In this case, etch depth is equal to a common depth requirement (e.g., depth requirement data 45 (FIG. 1), or component depth $d_{TSV}$ (FIG. 3)) for the distinct types of TSVs 32A, 32B, and k is a constant between 24 and 28 (selected as noted above). $D_{eff}$ for the unitary TSV, TSV 32B is equal to an outer diameter ($D_o$) of the unitary TSV 32B, and the effective diameter $D_{eff}$ for the annular TSV 32A is equal to a difference between an outer diameter ($D_o$) of the annular TSV 32A and an inner diameter ($D_i$) of the annular TSV 32A. According to various embodiments, TSV design system 28 is configured to calculate etch and fill rates for common process(es) in forming TSVs 32A, 32B. That is, TSV design system 28 is configured to calculate etch and fill rates for forming TSVs 32A, 32B such that both types of TSVs 32A, 32B in location 34 can be formed with at least one parallel sub-process. In some particular cases, etch and fill rates are calculated in order to completely sync the etch and/or fill processes in forming distinct types of TSVs 32A, 32B in location 34. FIG. 6 shows an example graphical depiction 70 of the relationship between etch depth and effective diameter (Deff) for distinct constants (k).

In some cases, as shown in FIG. 1, after calculating the etch and fill rates as discussed with respect to Process P2, Processes P1 and P2 may be repeated in order to determine alternative TSV arrangements that meet the requirements, e.g., impedance and other electrical requirements, of IC design 30. This iteration may be performed any number of times (or not at all) to evaluate potential alternative TSV arrangements and fabrication processes used to form TSVs in those arrangements. In some cases, etch and fill rates are recalculated and updated according to various distinct TSV arrangements and compared to determine one or more preferred arrangement(s).

With reference to FIG. 1 and FIG. 2, after calculating the etch and fill rates as discussed with respect to Process P2, an additional process, Process P3, can include: providing fabrication instructions (fab. instr.) 60 to form the distinct types of TSVs 32A, 32B according to the calculated etch and fill rates in the common process (such as RIE, wet etching, deposition, etc.). In some cases, TSV design system 28 can codify the common process of forming TSVs 32A, 32B, according to the depth requirement 40 in fabrication instructions 60. These fabrication instructions 60 may take the form of software code or other instructions, which when executed by at least one computing device (e.g., computing device 26), can cause the at least one computing device to perform processes or initiate processes, to form TSVs 32A, 32B. In some cases, fabrication instructions 60 are inserted in IC design (data) 30, and may be executed by a foundry computing system to form physical IC devices such as IC structure 130 (including TSVs 32A, 32B), from the IC design 30. TSV design system 28 can make fabrication instructions 60 available to one or more users 112, which may include one or more developers, fabrication facilities or contractors, IC designers, etc. capable of executing fabrication instructions 60 to form IC structure 130 including TSVs 32A, 32B. Fabrication instructions 60, e.g., in IC design (data) 30, can be provided to user(s) 112 via any conventional means (e.g., any data transmission means known in the art). It is understood that according to various embodiments, fabrication instructions 60 may be stored locally at TSV design system 28, or can be stored or otherwise retained at any number of distinct locations accessible to TSV design system 28, e.g., any external computing device or data storage device, or other distributed forms of such devices. Further, in various embodiments, the process of inserting fabrication instructions 60 in IC design data 30 includes creating a model, e.g., a data model, process flow model, logical model, etc. that represents the physical design of IC structure 130. In some cases, the IC design data 30, including fabrication instructions 60, is stored on a computer-readable storage medium, e.g., within TSV design system 28, or in another such medium. In some other embodiments, TSV design system 28 can provide the IC design data 30, including fabrication instructions 60, e.g., to a user 112, a customer, or a third party (e.g., a fabrication entity, or foundry) for formation of IC structure 130 according to IC design data 30. In some cases, TSV design system 28 is part of a manufacturing system that forms IC structure 140 according to IC design data 30 (including fabrication instructions 60).

According to various embodiments, as shown in FIG. 1, an optional pre-process (Process P0) performed by TSV design system 28 can include obtaining data (e.g., from a designer, developer, customer, etc.) about the electrical requirement (electrical requirement data 40) for the TSVs prior to identifying the types of TSVs 32A, 32B for placement within the IC design (data) 30. This process can be performed prior to process P1, and can include obtaining or otherwise detecting electrical requirement data 40 (as noted herein) for TSVs within IC design 30. This can further include analyzing IC design (data) 30 to detect depth requirement data 45, e.g., for subsequent use in Processes P1-P3 (and Process P4). It is understood that the electrical requirement data 40, depth requirement data 45 and IC design (data) 30 can be defined by the technological application of the IC design 30 (e.g., whether the IC structure 130 is a memory device, a logic device, a switching device, etc.) as well as material constraints for the IC structure 130 (e.g., material options such as types of conductors, insulators, etc. that can be reliably used within a given device dimension, environmental condition, etc.). According to various embodiments, Process P0 may be performed prior to Process P1, or contemporaneously with Process P1.

Figure 7:
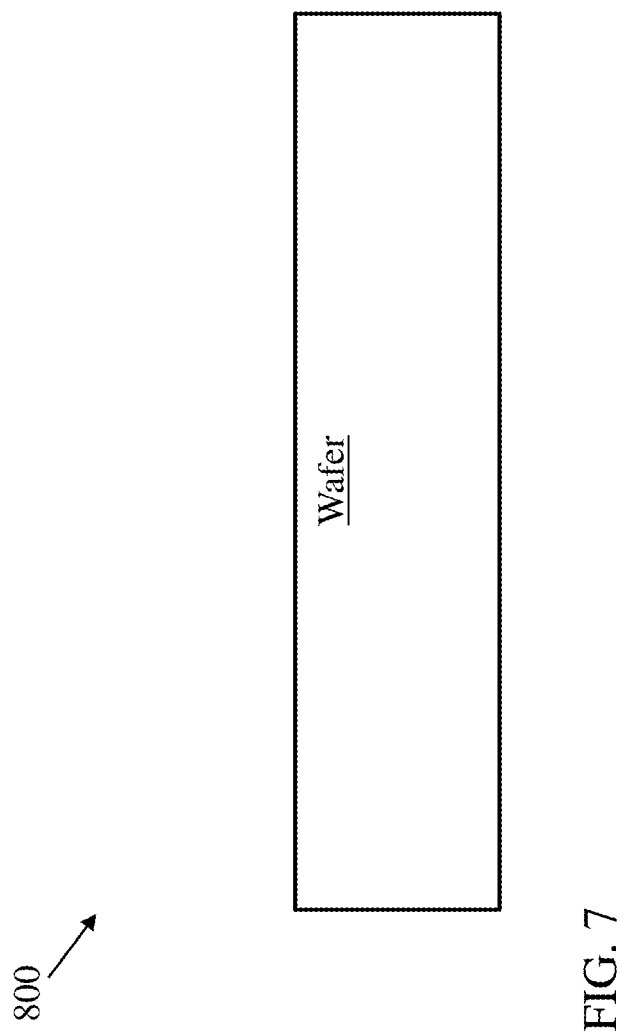
FIG. 7 shows a precursor structure prior to processes according to various embodiments of the disclosure.
Figure 8:
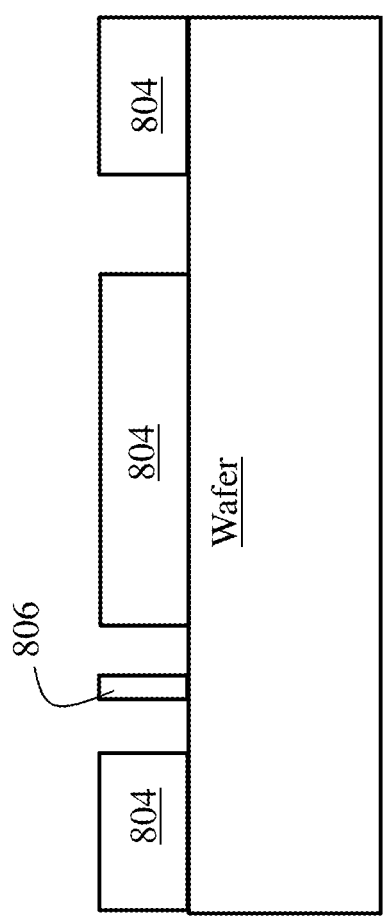
FIG. 8 shows a process in forming an integrated circuit according to various embodiments of the disclosure.
Figure 9:
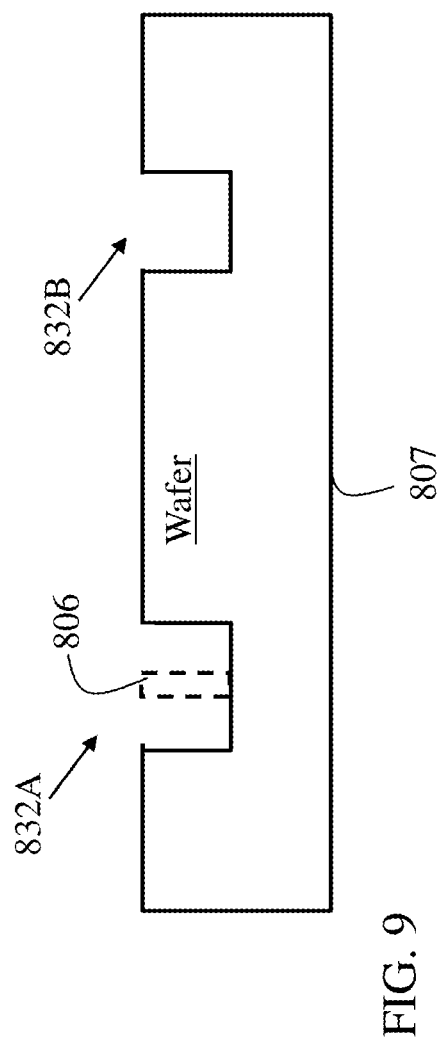
FIG. 9 shows an additional process in forming an integrated circuit according to various embodiments of the disclosure.
Figure 10:
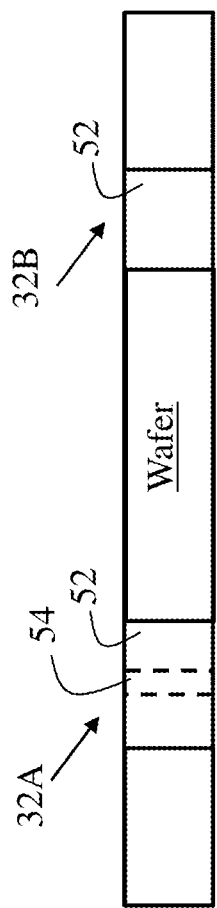
FIG. 10 shows an additional process in forming an integrated circuit according to various embodiments of the disclosure.
Figure 11:
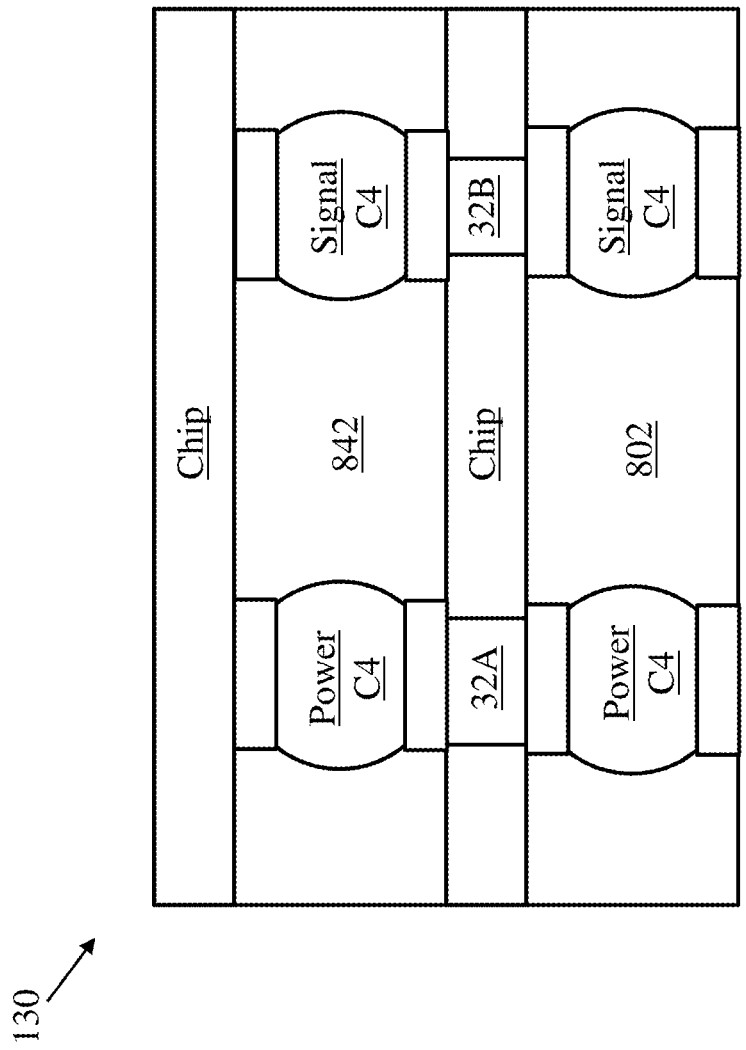
FIG. 11 shows an integrated circuit formed according to various embodiments of the disclosure.

In some cases, an additional, optional post-process (FIG. 1) can include Process P4: forming an IC (IC structure 130) from the IC design 30 and the fabrication instructions 60. In various embodiments, this process can include forming the distinct types of TSVs 32A, 32B according to the calculated etch and fill rates in the common process. FIGS. 7-11 illustrate processes in forming a portion of an IC structure 130 including distinct types of TSVs 32A, 32B. FIG. 7 shows a precursor device 800 including a Wafer layer, which may include one or more devices, such as logic devices, memory devices, etc. Wafer layer merely indicates that the layer has yet to be diced or otherwise cut into Chips (FIG. 11). FIG. 8 illustrates a first process including forming a mask 804 over Wafer, including at least one annular TSV mask feature 806 for forming an annular TSV 32A (shown later in process flow). Mask 804 can be deposited, spin coated, or otherwise conventionally formed over Chip. FIG. 9 illustrates etching into Wafer layer using mask 804 to form openings 832A (including remaining chip layer 834 surrounded by opening 832A) and 832B for subsequent formation of TSVs 32A and 32B, respectively. Etching may be performed according to various etching techniques noted herein, and at a rate determined by TSV design system 28 according to process P2 (FIG. 1). In various embodiments, etching of both openings 832A and 832B can be performed by a common etching process. In some cases, etching does not reach a bottom surface 807 of Wafer, such that openings 832A and 832B extend only partially into a depth of Wafer. After etching, mask 804 can be removed according to various conventional approaches, e.g., acid bath, polishing, etc. FIG. 10 illustrates an additional process of filling openings 832A and 832B with first material 52 (e.g., conductive material) to form TSVs 32A and 32B, respectively. In various embodiments, filling of both openings 832A and 832B can be performed by a common filling (e.g., deposition or plating) process. As shown, a second material 54, e.g., an insulator from pre-existing Wafer layer is located within TSV 32A, which is shown more clearly from the top view in FIG. 4. Also shown in FIG. 10, Wafer layer may be thinned to a thickness corresponding with a depth of TSVs 32A and 32B, via conventional polishing and/or planarization techniques. FIG. 11 illustrates additional processes of dicing Wafer into distinct Chips, and stacking Chip(s) with one or more Power C4, Signal C4, intermediate (e.g., insulator) layer(s) 842 and additional Chip(s). As shown, a Chip including TSVs 32A and 32B is stacked over a substrate layer 802 including a Power C4 and Signal C4, and intermediate layer 842, including an additional Power C4 and Signal C4, is stacked over the first Chip. In some cases, an additional Chip is stacked over intermediate layer 842. These components can be formed according to conventional deposition, etching, and polishing processes to form an IC structure 130 including TSVs 32A, 32B.

It is understood that in the flow diagrams shown and described herein, other processes may be performed while not being shown, and the order of processes can be rearranged according to various embodiments. Additionally, intermediate processes may be performed between one or more described processes. The flow of processes shown and described herein is not to be construed as limiting of the various embodiments.

Returning to FIG. 2, an illustrative environment 101 including TSV design system 28, for performing the functions described herein according to various embodiments of the disclosure is shown. To this extent, the environment 101 includes a computer system 102 that can perform one or more processes described herein in order to design TSVs (e.g., TSVs 32A, 32B) in an IC 130 (FIG. 1, FIG. 11). In particular, the computer system 102 is shown as including the TSV design system 28, which makes computer system 102 operable to analyze IC design data 30, including electrical requirement data 40, depth requirement data 45 and generate fabrication instructions 60 for forming TSVs 32A, 32B by performing any/all of the processes described herein and implementing any/all of the embodiments described herein.

The computer system 102 is shown including a computing device 26, which can include a processing component 104 (e.g., one or more processors), a storage component 106 (e.g., a storage hierarchy), an input/output (I/O) component 108 (e.g., one or more I/O interfaces and/or devices), and a communications pathway 110. In general, the processing component 104 executes program code, such as the TSV design system 28, which is at least partially fixed in the storage component 106. While executing program code, the processing component 104 can process data, which can result in reading and/or writing transformed data from/to the storage component 106 and/or the I/O component 108 for further processing. The pathway 110 provides a communications link between each of the components in the computer system 102. The I/O component 108 can comprise one or more human I/O devices, which enable a user (e.g., a human and/or computerized user) 112 to interact with the computer system 102 and/or one or more communications devices to enable the system user 112 to communicate with the computer system 102 using any type of communications link. To this extent, the TSV design system 28 can manage a set of interfaces (e.g., graphical user interface(s), application program interface, etc.) that enable human and/or system users 112 (e.g., customers) to interact with the TSV design system 28. Further, the TSV design system 28 can manage (e.g., store, retrieve, create, manipulate, organize, present, etc.) data, such as IC design data 30 using any solution, e.g., via wireless and/or hardwired means.

In any event, the computer system 102 can comprise one or more general purpose computing articles of manufacture (e.g., computing devices) capable of executing program code, such as the TSV design system 28, installed thereon. As used herein, it is understood that "program code" means any collection of instructions, in any language, code or notation, that cause a computing device having an information processing capability to perform a particular function either directly or after any combination of the following: (a) conversion to another language, code or notation; (b) reproduction in a different material form; and/or (c) decompression. To this extent, the TSV design system 28 can be embodied as any combination of system software and/or application software. It is further understood that the TSV design system 28 can be implemented in a cloud-based computing environment, where one or more processes are performed at distinct computing devices (e.g., a plurality of computing devices 26), where one or more of those distinct computing devices may contain only some of the components shown and described with respect to the computing device 26 of FIG. 2.

Further, the TSV design system 28 can be implemented using a set of modules 132. In this case, a module 132 can enable the computer system 102 to perform a set of tasks used by the TSV design system 28, and can be separately developed and/or implemented apart from other portions of the TSV design system 28. As used herein, the term "component" means any configuration of hardware, with or without software, which implements the functionality described in conjunction therewith using any solution, while the term "module" means program code that enables the computer system 102 to implement the functionality described in conjunction therewith using any solution. When fixed in a storage component 106 of a computer system 102 that includes a processing component 104, a module is a substantial portion of a component that implements the functionality. Regardless, it is understood that two or more components, modules, and/or systems may share some/all of their respective hardware and/or software. Further, it is understood that some of the functionality discussed herein may not be implemented or additional functionality may be included as part of the computer system 102.

When the computer system 102 comprises multiple computing devices 26, each computing device 26 may have only a portion of TSV design system 28 fixed thereon (e.g., one or more modules 132). However, it is understood that the computer system 102 and TSV design system 28 are only representative of various possible equivalent computer systems that may perform a process described herein. To this extent, in other embodiments, the functionality provided by the computer system 102 and TSV design system 28 can be at least partially implemented by one or more computing devices that include any combination of general and/or specific purpose hardware with or without program code. In each embodiment, the hardware and program code, if included, can be created using standard engineering and programming techniques, respectively.

Regardless, when the computer system 102 includes multiple computing devices 26, the computing devices can communicate over any type of communications link. Further, while performing a process described herein, the computer system 102 can communicate with one or more other computer systems using any type of communications link. In either case, the communications link can comprise any combination of various types of wired and/or wireless links; comprise any combination of one or more types of networks; and/or utilize any combination of various types of transmission techniques and protocols.

While shown and described herein as methods, systems and computer program products for designing TSVs in an IC design 30 (and structure 130), it is understood that aspects of the invention further provide various alternative embodiments. For example, in one embodiment, the invention provides a computer program fixed in at least one computer-readable medium, which when executed, enables a computer system to design a TSVs in an IC design 30 (and structure 130). To this extent, the computer-readable medium includes program code, such as the TSV design system 28 (FIG. 2), which implements some or all of the processes and/or embodiments described herein. It is understood that the term "computer-readable medium" comprises one or more of any type of tangible medium of expression, now known or later developed, from which a copy of the program code can be perceived, reproduced, or otherwise communicated by a computing device. For example, the computer-readable medium can comprise: one or more portable storage articles of manufacture; one or more memory/storage components of a computing device; paper; etc.

In another embodiment, the invention provides a method of providing a copy of program code, such as the TSV design system 28 (FIG. 2), which implements some or all of a process described herein. In this case, a computer system can process a copy of program code that implements some or all of a process described herein to generate and transmit, for reception at a second, distinct location, a set of data signals that has one or more of its characteristics set and/or changed in such a manner as to encode a copy of the program code in the set of data signals. Similarly, an embodiment of the invention provides a method of acquiring a copy of program code that implements some or all of a process described herein, which includes a computer system receiving the set of data signals described herein, and translating the set of data signals into a copy of the computer program fixed in at least one computer-readable medium. In either case, the set of data signals can be transmitted/received using any type of communications link.

In still another embodiment, the invention provides a method of designing TSVs in an IC design 30 (and structure 130). In this case, a computer system, such as the computer system 102 (FIG. 2), can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or I/O devices to the computer system; (3) incorporating and/or modifying the computer system to enable it to perform a process described herein; etc.

In any case, the technical effect of the various embodiments of the disclosure, including, e.g., the TSV design system 28, is to design TSVs in an IC design 30 (and structure 130). It is understood that according to various embodiments, the TSV design system 28 could be implemented to design a plurality of TSVs in one or more IC design(s) 30, as described herein. As described herein, TSV design system 28 can help to enhance the reliability of manufacturing TSVs, as well as improve the efficiency of such manufacturing processes, when compared with conventional systems and approaches.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

We claim:

1. A method comprising:
    identifying types of through-silicon vias (TSVs) for placement within an integrated circuit (IC) design based upon an electrical requirement for the TSVs, wherein the IC design includes distinct types of TSVs, wherein the distinct types of TSVs include TSVs having distinct functions;
    calculating etch and fill rates for the IC design with the distinct types of TSVs with common etching and filling processes, wherein the distinct types of TSVs include TSVs having a common depth within the IC design and distinct conductive volumes; and
    forming the distinct types of TSVs in an IC structure from the IC design with a fabrication device according to the calculated etch and fill rates in the common processes.

2. The method of claim 1, wherein the common depth is a same depth within a layer of the IC structure formed by the IC design and a same depth within the IC structure.

3. The method of claim 1, further comprising obtaining data about the electrical requirement for the TSVs prior to identifying the types of TSVs for placement within the IC design.

4. The method of claim 1, wherein the common process includes at least one parallel sub-process.

5. The method of claim 1, wherein the distinct types of TSVs include at least one unitary TSV consisting of a first material.

6. The method of claim 5, wherein the distinct types of TSVs further include at least one annular TSV including the first material and a second material distinct from the first material.

7. The method of claim 6, wherein calculating the etch and fill rates for the IC design with the distinct types of TSVs is performed according to:

$$\text{etch depth}=k^*(\text{effective diameter})^{0.3},$$

wherein the etch depth is equal to a common depth requirement for the distinct types of TSVs, k is a constant between 24 and 28, the effective diameter for the unitary TSV is equal to an outer diameter of the unitary TSV, and the effective diameter for the annular TSV is equal to a difference between an outer diameter of the annular TSV and an inner diameter of the annular TSV.

8. The method of claim 6, wherein the first material is a conductor and the second material is an insulator, wherein the annular TSV includes a power TSV and the unitary TSV includes a signal TSV.

9. A system comprising:
    at least one computing device configured to design through-silicon vias (TSVs) in an integrated circuit (IC) design by performing actions including:
        identifying types of TSVs for placement within the IC design based upon an electrical requirement for the TSVs, wherein the IC design includes distinct types of TSVs; and
        calculating etch and fill rates for the IC design with the distinct types of TSVs with common etching and filling processes,
        wherein the common processes include at least one parallel sub-process; and
    at least one fabrication device communicatively coupled to the at least one computing device, wherein the at least one fabrication device forms an IC structure including the distinct types of TSVs according to the calculated etch and fill rates in the common processes.

10. The system of claim 9, wherein the distinct types of TSVs include TSVs having a common depth within the IC design and distinct conductive volumes.

11. The system of claim 9, wherein the distinct types of TSVs include at least one unitary TSV consisting of a first material and at least one annular TSV including the first material and a second material distinct from the first material.

12. The system of claim 11, wherein calculating the etch and fill rates for the IC design with the distinct types of TSVs is performed according to:

$$\text{etch depth}=k^*(\text{effective diameter})^{0.3},$$

wherein the etch depth is equal to a common depth requirement for the distinct types of TSVs, k is a constant between 24 and 28, the effective diameter for the unitary TSV is equal to an outer diameter of the unitary TSV, and the effective diameter for the annular TSV is equal to a difference between an outer diameter of the annular TSV and an inner diameter of the annular TSV.

13. The system of claim 11, wherein the first material is a conductor and the second material is an insulator, wherein the annular TSV includes a power TSV and the unitary TSV includes a signal TSV.

14. A computer program product comprising program code stored on a non-transitory computer-readable medium, which when executed by at least one computing device, causes the at least one computing device to design through-silicon vias (TSVs) in an integrated circuit (IC) design by performing actions including:
  identifying types of TSVs for placement within the IC design based upon an electrical requirement for the TSVs, wherein the IC design includes distinct types of TSVs;
  calculating etch and fill rates for the IC design with the distinct types of TSVs with common etching and filling processes,
  wherein the distinct types of TSVs include TSVs having a common depth within the IC design and distinct conductive volumes, wherein the common processes include at least one parallel sub-process; and
  causing a fabrication device, communicatively coupled to the at least one computing device, to form an IC structure including the distinct types of TSVs according to the calculated etch and fill rates in the common processes.

15. The computer program product of claim 14, wherein the distinct types of TSVs include at least one unitary TSV consisting of a first material and at least one annular TSV including the first material and a second material distinct from the first material.

16. The computer program product of claim 15, wherein calculating the etch and fill rates for the IC design with the distinct types of TSVs is performed according to:

$$\text{etch depth} = k^*(\text{effective diameter})^{0.3},$$

wherein the etch depth is equal to a common depth requirement for the distinct types of TSVs, k is a constant between 24 and 28, the effective diameter for the unitary TSV is equal to an outer diameter of the unitary TSV, and the effective diameter for the annular TSV is equal to a difference between an outer diameter of the annular TSV and an inner diameter of the annular TSV.

17. The computer program product of claim 15, wherein the first material is a conductor and the second material is an insulator, wherein the annular TSV includes a power TSV and the unitary TSV includes a signal TSV.

18. The system of claim 10, wherein the distinct types of TSVs include TSVs having distinct functions, wherein the fabrication instructions are used to form an IC structure having the distinct types of TSVs from the IC design.

19. The computer program product of claim 14, wherein the distinct types of TSVs include TSVs having distinct functions, wherein the fabrication instructions are used to form an IC structure having the distinct types of TSVs from the IC design.

* * * * *